United States Patent
Landru et al.

(10) Patent No.: US 11,881,429 B2
(45) Date of Patent: *Jan. 23, 2024

(54) METHOD FOR TRANSFERRING A USEFUL LAYER ONTO A SUPPORT SUBSTRATE

(71) Applicant: Soitec, Bernin (FR)

(72) Inventors: Didier Landru, Le Champ-près-Froges (FR); Oleg Kononchuk, Theys (FR); Nadia Ben Mohamed, Echirolles (FR)

(73) Assignee: SOITEC, Bernin (FR)

( * ) Notice: Subject to any disclaimer, the term of this patent is extended or adjusted under 35 U.S.C. 154(b) by 100 days.

This patent is subject to a terminal disclaimer.

(21) Appl. No.: 17/439,300

(22) PCT Filed: Feb. 26, 2020

(86) PCT No.: PCT/FR2020/050368
§ 371 (c)(1),
(2) Date: Sep. 14, 2021

(87) PCT Pub. No.: WO2020/188168
PCT Pub. Date: Sep. 24, 2020

(65) Prior Publication Data
US 2022/0157651 A1    May 19, 2022

(30) Foreign Application Priority Data

Mar. 15, 2019   (FR) ...................... 1902671

(51) Int. Cl.
*H01L 21/762*   (2006.01)
*H01L 21/265*   (2006.01)
*H01L 21/78*    (2006.01)

(52) U.S. Cl.
CPC .. *H01L 21/76254* (2013.01); *H01L 21/26506* (2013.01); *H01L 21/7806* (2013.01)

(58) Field of Classification Search
CPC ......... H01L 21/76254; H01L 21/26506; H01L 21/7806

(Continued)

(56) References Cited

U.S. PATENT DOCUMENTS 9,914,233 B2     3/2018   Didier
2006/0014363 A1*  1/2006  Daval ............... H01L 21/76254
                                                    438/455

(Continued)

FOREIGN PATENT DOCUMENTS

EP       2802001 A1    11/2014
EP       2933828 B1    10/2016

(Continued)

OTHER PUBLICATIONS

French Search Opinion for French Application No. 1902671 dated Sep. 4, 2019, 4 pages.

(Continued)

*Primary Examiner* — Duy T Nguyen
(74) *Attorney, Agent, or Firm* — TraskBritt (57) ABSTRACT

A method for transferring a useful layer to a carrier substrate, includes the following steps: a) providing a donor substrate including a buried weakened plane; b) providing a carrier substrate; c) joining the donor substrate, by its front face, to the carrier substrate along a bonding interface so as to form a bonded structure; d) annealing the bonded structure in order to apply a weakening thermal budget thereto and to bring the buried weakened plane to a defined level of weakening; and e) initiating a splitting wave in the weakened plane by applying a stress to the bonded structure, the splitting wave self-propagating along the weakened plane to result in the useful layer being transferred to the carrier (Continued)

substrate. The splitting wave is initiated when the bonded structure is subjected to a temperature between 150° C. and 250° C.

20 Claims, 6 Drawing Sheets

(58) Field of Classification Search
USPC .......................................................... 438/455
See application file for complete search history.

(56) References Cited

U.S. PATENT DOCUMENTS

| 2007/0277269 | A1* | 11/2007 | Alexandrov | ......... | C07K 14/415 |
| | | | | | 536/23.6 |
| 2007/0281445 | A1* | 12/2007 | Nguyen | ............ | H01L 21/76254 |
| | | | | | 257/E21.237 |
| 2015/0303098 | A1* | 10/2015 | Landru | ............... | H01L 21/6835 |
| | | | | | 438/458 |

FOREIGN PATENT DOCUMENTS

| WO | 2005/043615 A1 | 5/2005 |
| WO | 2005/043616 A1 | 5/2005 |

OTHER PUBLICATIONS

French Search Report for French Application No. 1902671 dated Sep. 4, 2019, 2 pages.
International Search Report for International Application No. PCT/FR2020/050368 dated Jun. 26, 2021, 3 pages.
International Written Opinion for International Application No. PCT/FR2020/050368 dated Jun. 26, 2021, 6 pages.
Singapore Written Opinion for Application No. 11202109929X dated Jun. 9, 2023, 17 pages.
Taiwanese Office Action for Application No. 11220698030 dated Jul. 19, 2023, 7 pages.

* cited by examiner

METHOD FOR TRANSFERRING A USEFUL LAYER ONTO A SUPPORT SUBSTRATE

CROSS-REFERENCE TO RELATED APPLICATIONS

This application is a national phase entry under 35 U.S.C. § 371 of International Patent Application PCT/FR2020/050368, filed Feb. 26, 2020, designating the United States of America and published as International Patent Publication WO 2020/188168 A1 on Sep. 24, 2020, which claims the benefit under Article 8 of the Patent Cooperation Treaty to French Patent Application Serial No. 1902671, filed Mar. 15, 2019.

TECHNICAL FIELD

The present disclosure relates to the field of microelectronics. In particular, the present disclosure relates to a process for transferring a useful layer to a carrier substrate.

BACKGROUND

Figure 1:
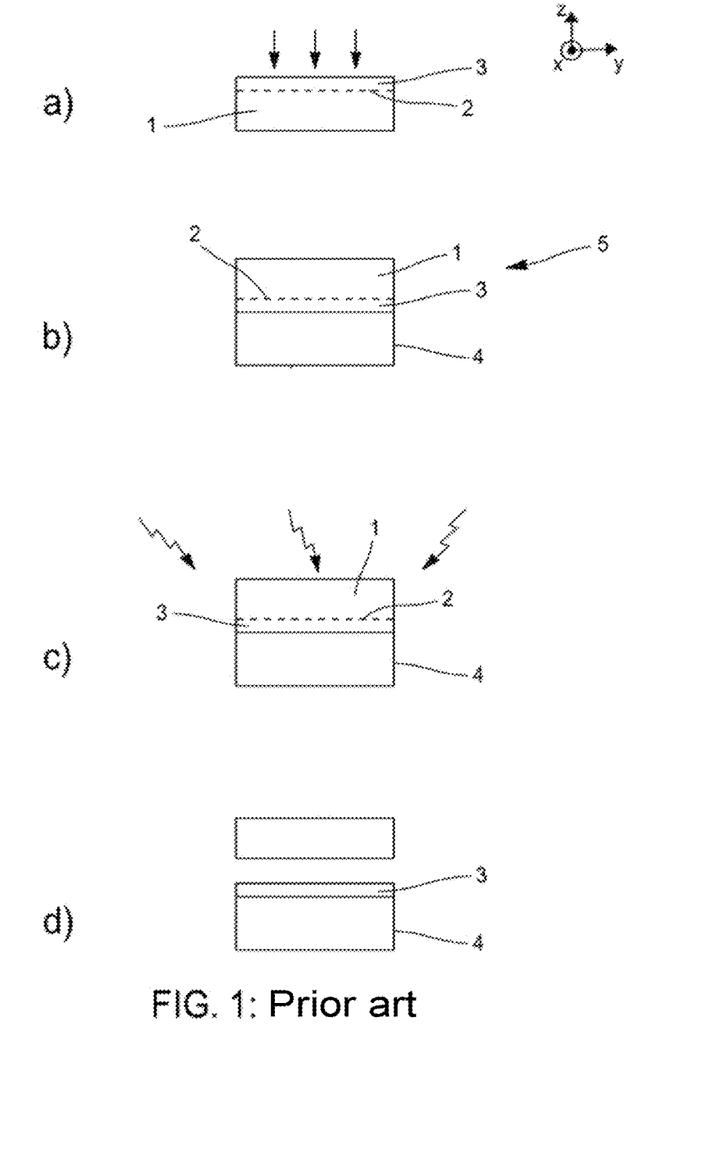
FIG. 1 shows a process for transferring a thin layer according to the prior art.

A process for transferring a useful layer 3 to a carrier substrate 4, shown in FIG. 1, is known from the prior art; this process, described, in particular, in documents WO2005043615 and WO2005043616, comprises the following steps:

forming a buried weakened plane 2 (also referred to as buried weakened layer 2) by implanting light species into a donor substrate 1 so as to form a useful layer 3 between this plane and a surface of the donor substrate;

next, joining the donor substrate 1 to a carrier substrate 4 to form a bonded structure 5;

applying a heat treatment to the bonded structure 5 in order to weaken the buried weakened plane;

and lastly, initiating a splitting wave by means of an energy pulse applied at the level of the buried weakened layer 2, with self-sustained propagation of the splitting wave in the donor substrate 1 along the buried weakened plane 2.

In this process, the species implanted at the level of the buried weakened layer 2 initiate the development of microcavities. The weakening heat treatment has the effect of promoting the growth and pressurization of these microcavities. By applying additional outside forces (energy pulse) after the heat treatment, a splitting wave is initiated in the buried weakened layer 2, which wave propagates in a self-sustained manner, resulting in the useful layer 3 being transferred through detachment at the level of the buried weakened plane 2. Such a process makes it possible, in particular, to decrease the roughness of the surface after transfer.

This process may be used to produce silicon-on-insulator (SOI) substrates. In this case, the donor substrate 1 and the carrier substrate 4 are each formed of a silicon wafer, the standard diameter of which is typically 200 mm, 300 mm or 450 mm for later generations. Either or both of the donor substrate 1 and the carrier substrate 4 are surface-oxidized.

SOI substrates must comply with very stringent specifications. This is particularly the case for the average thickness and the uniformity of thickness of the useful layer 3. Complying with these specifications is necessary for the correct operation of the semiconductor devices that will be formed in and on this useful layer 3.

In some cases, the architecture of these semiconductor devices requires SOI substrates exhibiting very low average thickness of the useful layer 3, for example, lower than 50 nm, and exhibiting very high uniformity of thickness for the useful layer 3. The expected uniformity of thickness may be about 5% at most, corresponding to variations typically from +/−0.3 nm to +/−1 nm over the entire surface of the useful layer 3. Even if additional finishing steps, such as etches or surface-smoothing heat treatments, are carried out after the useful layer 3 has been transferred to the carrier substrate 4, it is important for the morphological surface properties (in particular, uniformity of thickness and surface roughness) to be as favorable as possible after transfer in order to ensure that the end specifications are met.

The applicant has observed that, when the splitting wave is initiated after the heat treatment at ambient temperature by applying an energy pulse to the buried weakened plane 2, some useful layers 3 may include, after transfer, marbling-like irregular patterns as local variations in thickness, the amplitude of which is about a nanometer or half a nanometer. This marbling may be distributed over the entirety of the useful layer 3, or over only a portion thereof. It contributes to the non-uniformity of the useful layer 3.

This type of non-uniformity in the thickness of the useful layer 3 is very difficult to eliminate using the typical finishing techniques (etching, sacrificial oxidation, smoothing heat treatment, etc.) because these techniques are not effective in erasing irregular patterns of this amplitude.

BRIEF SUMMARY

The present disclosure relates to a process for transferring a useful layer to a carrier substrate and aims, in particular, to improve the uniformity of thickness of the useful layers after transfer.

The present disclosure relates to a process for transferring a useful layer to a carrier substrate, comprising the following steps:

a) providing a donor substrate including a buried weakened plane, the useful layer being delimited by a front face of the donor substrate and the buried weakened plane;

b) providing a carrier substrate;

c) joining the donor substrate, by its front face, to the carrier substrate along a bonding interface so as to form a bonded structure;

d) annealing the bonded structure in order to apply a weakening thermal budget thereto and to bring the buried weakened plane to a defined level of weakening; and e) initiating a splitting wave in the buried weakened plane by applying a stress to the bonded structure, the splitting wave propagating in a self-sustained manner along the buried weakened plane in order to result in the useful layer being transferred to the carrier substrate.

The transfer process is noteworthy in that the splitting wave is initiated when the bonded structure is subjected, at least in its hottest region, to a temperature between 150° C. and 250° C.

According to other advantageous and non-limiting features of the present disclosure, taken alone or in any technically feasible combinations:

the maximum temperature is between 180° C. and 220° C.;

the anneal in step d) reaches a maximum hold temperature between 300° C. and 600° C.;

the weakening thermal budget is between 40% and 95% of a splitting thermal budget, the splitting thermal budget leading to spontaneous initiation of the splitting wave in the buried weakened plane during the anneal;

the initiation in step e) takes place directly after the anneal in step d), before the hottest region of the bonded structure reaches a temperature below 150° C.;

the anneal in step d) takes place in a horizontally or vertically configured heat treatment apparatus, suitable for batch-treating a plurality of bonded structures, and the initiation in step e) takes place when the bonded structures exit the apparatus;

the application of a stress to the buried weakened plane corresponds to the application of a local mechanical load to the bonded structure; in particular, to the periphery of the structure;

the local mechanical load is applied by inserting a wedge at the bonding interface of the bonded structure, between chamfered edges of the donor substrate and of the carrier substrate, respectively, of the bonded structure;

the local mechanical load is applied in a region of the bonded structure that experiences lower temperatures when there is a temperature gradient across the bonded structure in step e);

the local mechanical load is applied to the bonded structure when the temperature gradient is about 80° C.; and the donor substrate and the carrier substrate are made of monocrystalline silicon, and wherein the buried weakened plane is formed by ion implantation of light species into the donor substrate, the light species being chosen from hydrogen and helium, or a combination of hydrogen and helium.

BRIEF DESCRIPTION OF THE DRAWINGS

Other features and advantages of the present disclosure will become apparent from the following detailed description of embodiments of the present disclosure, which description is given with reference to the accompanying figures, in which.

DETAILED DESCRIPTION

In the description, the same reference signs in the figures might be used for elements of the same type. The figures are schematic representations that, for the sake of legibility, are not to scale. In particular, the thicknesses of the layers along the z-axis are not to scale with respect to the lateral dimensions along the x- and y-axes; and the relative thicknesses of the layers with respect to one another are not necessarily respected in the figures. It should be noted that the coordinate system (x,y,z) of FIG. 1 applies to FIG. 2.

The present disclosure relates to a process for transferring a useful layer 3 to a carrier substrate 4. The useful layer 3 is named as such because it is intended for use in the production of components in the fields of microelectronics or microsystems. The useful layer and the carrier substrate may vary in nature depending on the target component type and target application. Since silicon is currently the most commonly used semiconductor material, the useful layer and the carrier substrate may be made of, in particular, monocrystalline silicon, but are not limited, of course, to this material.

The transfer process according to the present disclosure first comprises a step a) of providing a donor substrate 1, from which the useful layer 3 will be taken. The donor substrate 1 includes a buried weakened plane 2 (FIG. 2-a)). The latter is advantageously formed by ion-implanting light species into the donor substrate 1 at a defined depth. The light species are chosen, preferably, from hydrogen and helium, or a combination of hydrogen and helium, since these species promote the formation of microcavities around the defined implantation depth, resulting in the buried weakened plane 2.

Figure 2:
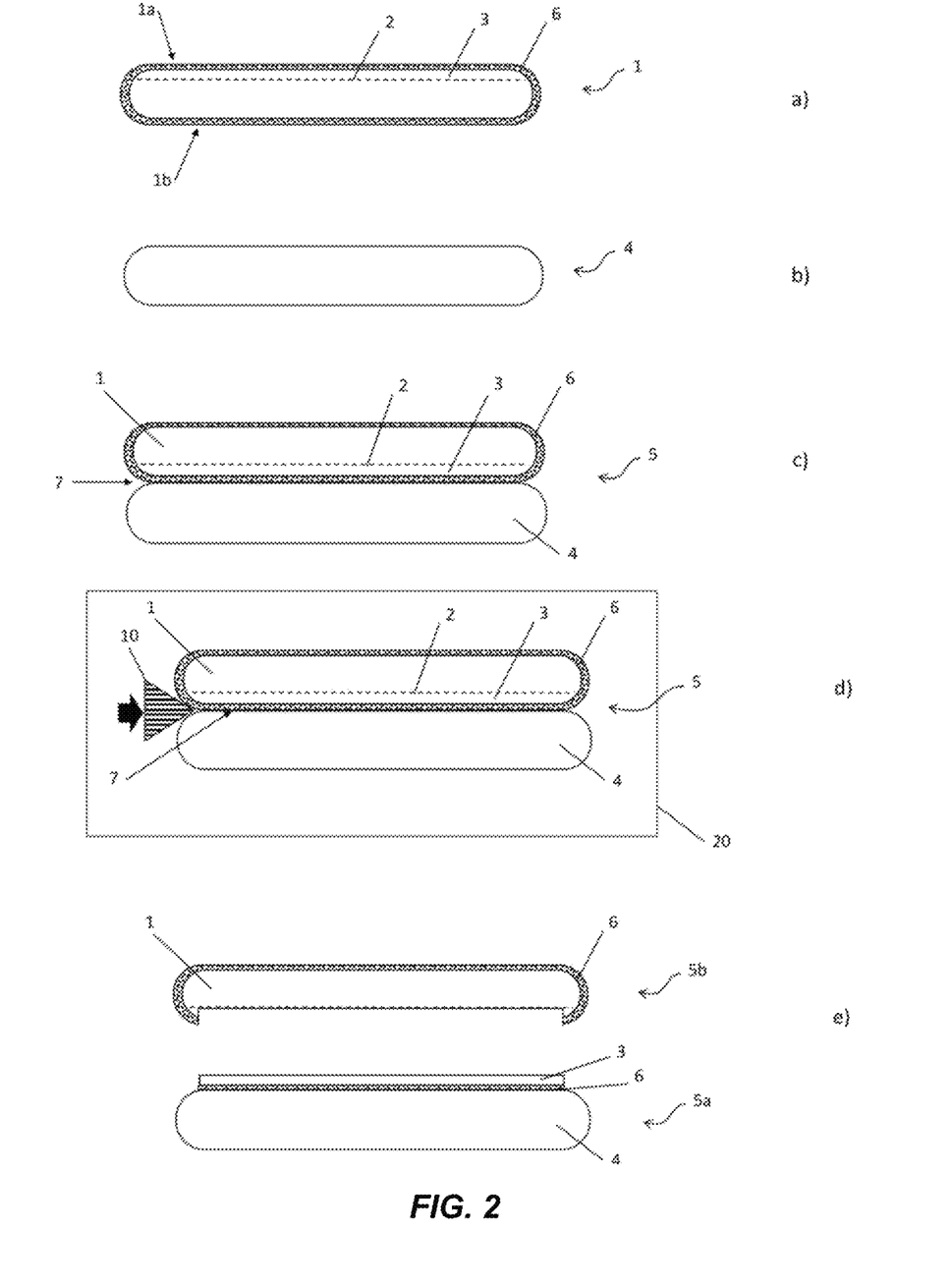
FIG. 2 shows a transfer process according to the present disclosure.

The useful layer 3 is delimited by a front face 1a of the donor substrate 1 and the buried weakened plane 2.

The donor substrate 1 may be formed of at least one material chosen from silicon, germanium, silicon carbide, IV-IV, III-V or II-VI semiconductor compounds and piezoelectric materials (for example, $LiNbO_3$, $LiTaO_3$, etc.). It may further include one or more surface layers arranged on the front face 1a and/or on the back face 1b thereof, which may be of any nature; for example, dielectric.

The transfer process also comprises a step b) of providing a carrier substrate 4 (FIG. 2-b)).

The carrier substrate may be formed, for example, of at least one material chosen from the silicon, silicon carbide, glass, sapphire, aluminum nitride or any other material that might be available in substrate form. It may also include one or more surface layers of any nature; for example, dielectric.

As mentioned above, one advantageous application of the transfer process according to the present disclosure is the production of SOI substrates. In this particular case, the donor substrate 1 and the carrier substrate 4 are made of monocrystalline silicon, and either or both of the substrates include a surface layer of silicon oxide 6 on the front face thereof.

The transfer process next comprises a step c) of joining the donor substrate 1, by its front face 1a, to the carrier substrate 4 along a bonding interface 7 so as to form a bonded structure 5 (FIG. 2-c)).

The attachment operation may be carried out using any known method, in particular, by direct bonding by molecular adhesion, by thermocompression or by electrostatic bonding. These well-known prior-art techniques will not be described in detail here. However, it is recalled that, prior to joining, the donor substrate 1 and the carrier substrate 4 will have undergone surface-activation and/or cleaning sequences in order to ensure the quality of the bonding interface 7 in terms of defects and bonding energy.

In the transfer process according to the present disclosure, a step d) of annealing the bonded structure 5 is then carried out in order to apply a weakening thermal budget to the bonded structure 5 and to bring the buried weakened plane to a defined level of weakening (FIG. 2-d)). The time/temperature pairs applied during the anneal determine the thermal budget to which the bonded structure 5 is subjected.

The range of temperatures over which the anneal may be carried out for this operation of weakening the buried plane 2 depends primarily on the type of bonded structure 5 (homostructure or heterostructure) and on the nature of the donor substrate 1.

By way of example, in the case of a donor substrate 1 and a carrier substrate 4 made of silicon, the anneal in step d) reaches a maximum hold temperature that is typically between 200° C. and 600° C., advantageously between 300° C. and 500° C. and even more advantageously between 350° C. and 450° C.

More generally, the maximum hold temperature could, for materials used for the donor substrate 1 and/or for the carrier substrate 4 other than silicon, typically be between 200° C. and 800° C.

The anneal may include a temperature ramp-up (typically between 200° C. and the maximum hold temperature) and a hold at the maximum temperature. In general, the duration of such an anneal will be between a few tens of minutes and several hours, depending on the maximum hold temperature of the anneal.

The level of weakening of the buried weakened plane 2 is defined by the area occupied by the microcavities present in the buried weakened layer 2. In the case of a donor substrate 1 made of silicon, this area occupied by the microcavities may be characterized by infrared microscopy.

The level of weakening may range from a low level (<1%, below the detection threshold of the characterizing instruments) up to more than 80%, depending on the thermal budget applied to the bonded structure 5 during the anneal.

The weakening thermal budget is always kept below a splitting thermal budget for which spontaneous initiation of the splitting wave in the buried weakened plane 2 is obtained during the anneal. Preferably, the weakening thermal is between 40% and 95% of the splitting thermal budget.

In the transfer process according to the present disclosure, a step e) of initiating a splitting wave along the buried weakened plane 2 is next carried out by applying a stress to the buried weakened plane 2 of the bonded structure 5 (FIG. 2-*e*)). After initiation, the splitting wave propagates in a self-sustained manner, resulting in the separation of the bonded structure 5 at the buried weakened plane 2. Self-sustained propagation means that once initiated, the spitting wave propagates by itself, without the application of external stress, throughout the entire extent of the buried weakened plane 2, so that the useful layer 3 is completely detached from the donor substrate 1 and transferred to the carrier substrate 4. A transferred assembly 5*a* and the remainder 5*b* of the donor substrate 1 are thus obtained (FIG. 2-*f*)).

The external stress is advantageously local and may be caused mechanically or by any other means, such as, for example, local heating by means of a laser or energy transfer by means of ultrasound.

It is recalled that, by applying the transfer process of the prior art mentioned in the introduction, which involves mechanically initiating the splitting wave at ambient temperature, the applicant has observed marbling-like irregular patterns which negatively affect the uniformity of thickness of the useful layer 3 after transfer. The applicant has identified that these irregular patterns are related to an instability in the propagation of the splitting wave due to insufficient energy stored in the [bonded structure 5/buried weakened layer 2] system.

To overcome these problems and to improve the uniformity of thickness of the useful layer 3 after transfer, the transfer process according to the present disclosure envisages that the splitting wave is initiated, in step e), by applying an external stress to the buried weakened plane 2 when the bonded structure 5 is subjected, at least in its hottest region, to a temperature between 150° C. and 250° C. In practice, there is often a temperature gradient across the bonded structure 5, so the present disclosure envisages that the region of the bonded structure 5 that is subjected to the highest temperatures (its hottest region) experiences a temperature between 150° C. and 250° C. In other words, splitting is initiated when the maximum temperature to which the bonded structure 5 is subjected, locally in its hottest region or uniformly over its entire extent, is within this temperature range.

Advantageously, the aforementioned maximum temperature is between 180° C. and 220° C., preferably, around 200° C.

For initiating the splitting wave when at least the hottest region of the bonded structure 5 is at a temperature higher than 150° C., the energy stored in the system, and in particular, the energy stored in the buried weakened plane 2 due to the presence of pressurized gaseous species in the microcavities, is sufficient to ensure stable and self-sustained propagation of the splitting wave.

Instigating initiation when the bonded structure 5 is subjected to a maximum temperature lower than 250° C. limits the energy stored in the system such that excess energy released during splitting (i.e., the energy that has not been consumed in breaking the material) does not result in the formation of other types of patterns on the surface of the transferred useful layer 3. Specifically, the applicant has observed that when the excess energy released during splitting is too high, high-amplitude regular patterns may appear and negatively affect the uniformity of thickness of the useful layer 3 after transfer. This may be the case, for example, when the splitting budget is applied to a bonded structure 5 and a splitting wave is initiated spontaneously at the anneal hold temperature (for example, 400° C.). Too much energy stored and released during the propagation of the splitting wave is therefore also problematic with respect to the uniformity of thickness of the useful layer 3 after transfer.

The energy stored in the system is dependent both on the level of weakening of the buried weakened plane 2 and on the temperature at which the splitting wave is initiated and will propagate. The transfer process according to the present disclosure allows the splitting wave to be initiated when the energy stored in the system is both sufficient to ensure stable and self-sustaining propagation (thus limiting the appearance of irregular patterns) and not overly high so as to limit the amplitude of regular patterns that also negatively affect the uniformity of thickness.

Figure 3A:
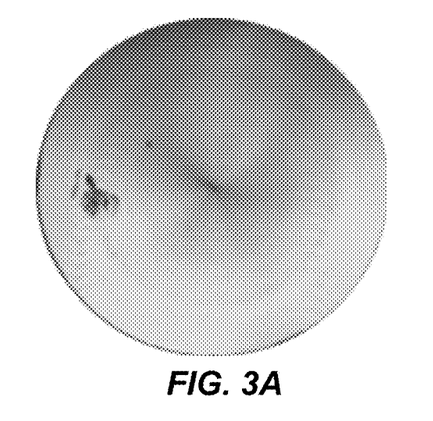
FIGS. 3A to 3C show haze maps at the surface of useful layers including non-uniformities of thickness after transfer.
Figure 3B:
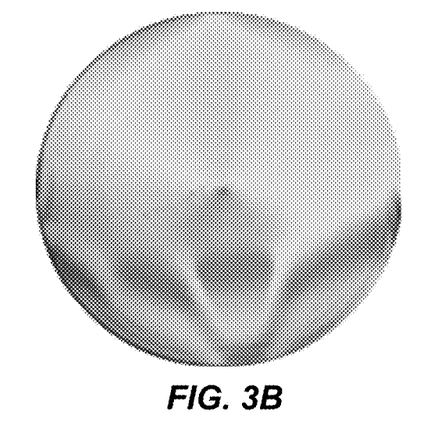
Figure 3C:
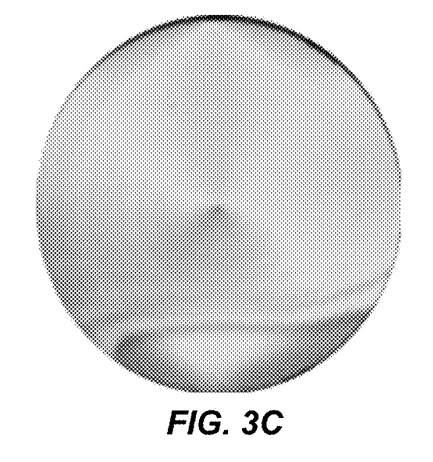

By way of example, FIGS. 3A-C show haze maps at the surface of useful layers 3 after, respectively, spontaneous splitting, mechanical splitting initiated at ambient temperature and mechanical splitting initiated with a maximum temperature to which the bonded structure is subjected of 100° C. It should be noted that the aforementioned mechanical splitting operations were initiated by applying a local mechanical load to the bonded structures 5 and generating strain in the buried weakened plane 2. In each case, regular (FIG. 3A) or irregular (FIGS. 3B and 3C) marbling-like patterns, which negatively affect the uniformity of thickness of the useful layer 3 after transfer (between 0.5 nm and 1.5 nm in amplitude), are observed. These patterns have been made apparent by measurement of haze, which corresponds to the intensity of the light scattered by the surface of the useful layer 3, using the SURF SCAN™ inspection tool by KLA-Tencor.

Figure 4:
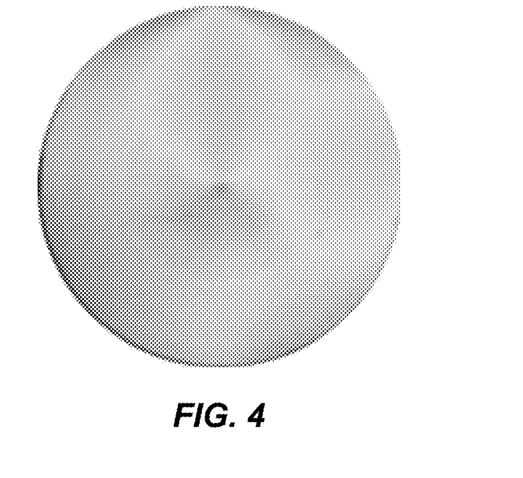
FIG. 4 shows a haze map at the surface of a useful layer transferred using a transfer process according to the present disclosure.

FIG. 4 shows a haze map at the surface of a useful layer 3 transferred using a transfer process according to the present disclosure: i.e., after splitting is initiated when the bonded structure 5 is subjected, at least in its hottest region, to a temperature of 200° C. by applying a local mechanical load to the bonded structure 5, generating strain in the buried weakened plane 2. No pattern, whether regular or irregular and marbling-like, is present, and the uniformity of thickness of the useful layer 3 is thus substantially improved.

According to a first advantageous variant, the initiation in step e) takes place directly after the anneal in step d), before the hottest region of the bonded structure 5 reaches a temperature below 150° C. For example, when the anneal in step d) features a temperature ramp-up to 400° C. followed by a temperature ramp-down, initiation takes place when the bonded structure 5 (at least in its hottest region) is subjected to a maximum temperature below or equal to 250° C. and before it reaches a maximum temperature of 150° C.

In practice, the step e) of initiating the splitting wave could take place, in particular, when the bonded structure 5 exits the heat treatment apparatus 20 used for the anneal, in a controlled exit zone 23 in which the bonded structure 5 is subjected to a maximum temperature higher than 150° C. and lower than or equal to 250° C. (FIG. 2-e)). In particular, the anneal in step d) may take place in a horizontally or vertically configured heat treatment apparatus 20, suitable for batch-treating a plurality of bonded structures 5; the initiation in step e) then takes place when the bonded structures 5 exit the heat treatment apparatus 20, in the exit zone 23 in which the maximum temperature to which the bonded structures 5 are subjected is controlled to be within the range required for the initiation of the splitting wave. The external stress for triggering the initiation of the splitting wave is advantageously applied to the bonded structure 5 successively, as they pass through the controlled exit zone 23.

According to a second variant, the initiation in step e) takes place after the hottest region of the bonded structure 5 has reached a temperature below 150° C. In this case, the bonded structure 5 is kept under a controlled atmosphere between the end of the anneal in step d) and the time when the splitting wave is initiated, which will require the bonded structure 5 to be brought to a maximum temperature between 150° C. and 250° C. What is understood by "controlled atmosphere" in this case is a dry atmosphere exhibiting less than 0.1% humidity. For example, when the anneal in step d) features a temperature ramp-up to 400° C. followed by a temperature ramp-down to 150° C. before returning the bonded structure 5 to ambient temperature, this structure is kept under a dry atmosphere until the initiation of the splitting wave in step e).

Advantageously, for either of the variants mentioned, the application of a stress to the buried weakened plane 2 corresponds to the application of a local mechanical load to the bonded structure 5, in particular, to the periphery of the structure, so as to initiate the splitting wave. By way of example, the local mechanical load may be applied by inserting a wedge 10 at the bonding interface 7 of the bonded structure 5, between chamfered edges of the donor substrate 1 and of the carrier substrate 4, respectively, of the bonded structure 5. This results in tensile strain being generated in the buried weakened plane 2.

Preferably, the local mechanical load is applied in a region of the bonded structure 5, which experiences lower temperatures when there is a temperature gradient across the bonded structure 5 in step e). The region is referred to hereinafter as the "cool region," by comparison with the hottest region of the bonded structure 5 mentioned above.

Figure 5:
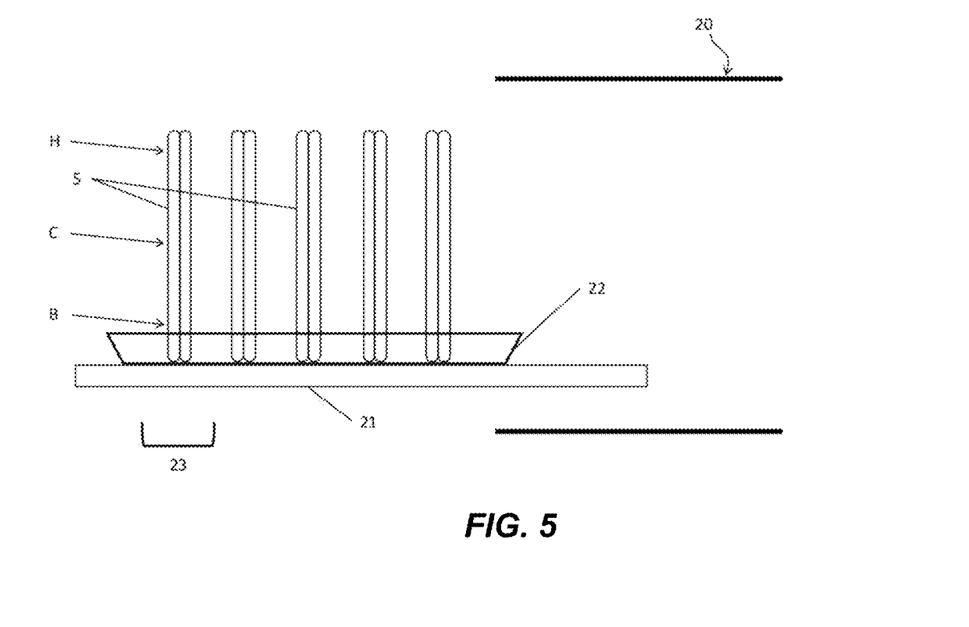
FIG. 5 shows a step in a transfer process according to the present disclosure.
Figure 6:
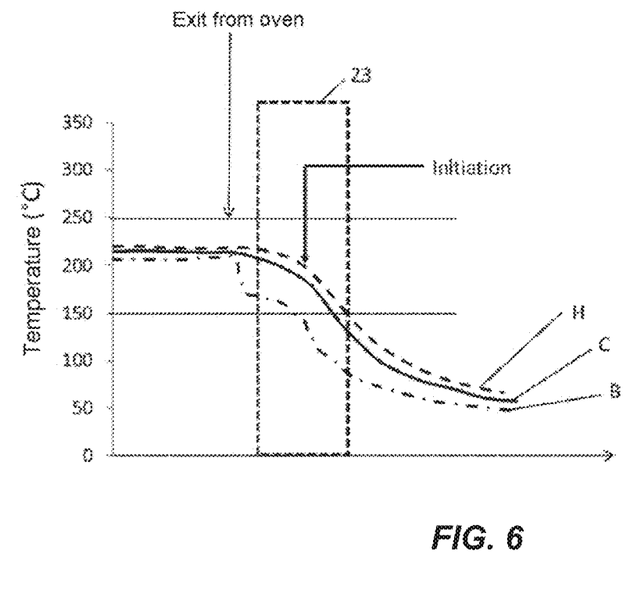
FIG. 6 is a graph showing the temperatures and the thermal gradient seen by a bonded structure in a step in a transfer process according to the present disclosure.

Returning, for example, to the case of the first variant mentioned above, when one or more bonded structures 5 exit the heat treatment apparatus 20 in which the anneal has taken place, there is generally a thermal gradient across each bonded structure 5 (FIGS. 5 and 6). This gradient is generally due to the geometry of the oven and the presence of a system for holding the bonded structures 5, which affects heat dissipation. For example, in the case of a horizontally configured oven 20 in which the bonded structures 5 are placed vertically into cassettes 22 that are borne by a charge shovel 21, it is observed that the lower region B of the bonded structures 5 (i.e., that closest to the charge shovel 21) is cooler than the upper region H of the bonded structures 5. The local mechanical load is then applied, preferably, in the lower region B of the bonded structure 5.

Again advantageously, the local mechanical load is applied to the bonded structure 5 when the temperature gradient is about 80° C., i.e., 80° C.+/−15° C. FIG. 6 shows the temperature gradient measured across a bonded structure 5 after exiting the oven, in the upper region H, central region C and a lower region B.

The applicant has observed that a temperature gradient of 80° C.+/−10° C. experienced by the bonded structure 5 when the splitting wave is initiated contributes to improving the uniformity of thickness of the useful layer 3 after transfer.

Exemplary Application

The transfer process according to the present disclosure may be used for the production of SOI substrates, the useful layer 3 of which is very thin, in particular, between a few nanometers and 50 nm.

The example used is that of donor 1 and carrier 4 substrates made of monocrystalline silicon, each taking the form of a 300 mm-diameter wafer. The donor substrate is covered with a layer of silicon oxide 6 with a thickness of 50 nm. The buried weakened plane 2 is formed in the donor substrate 1 by co-implanting hydrogen and helium ions under the following conditions:

H: implantation energy 38 keV, dose 1E16 H/cm$^2$; and
He: implantation energy 25 keV, dose 1E16 He/cm$^2$.

The buried weakened layer 2 is located at a depth of about 290 nm from the front face 1a of the donor substrate 1. It delimits, with the silicon oxide layer 6, a useful layer 3 of about 240 nm.

The donor substrate 1 is joined to the carrier substrate 4 by direct bonding by molecular adhesion, to form the bonded structure 5. Prior to joining, the donor substrate 1 and the carrier substrate 4 will have undergone known surface-activation and/or cleaning sequences in order to ensure the quality of the bonding interface 7 in terms of defects and bonding energy.

Figure 7:
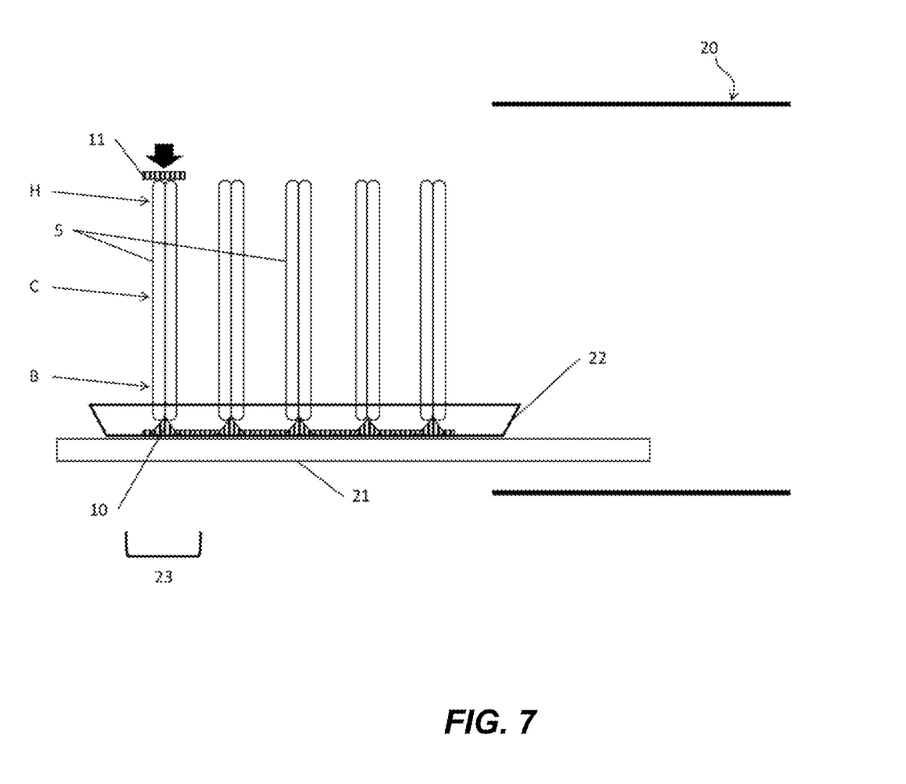
FIG. 7 shows a step in a transfer process according to the present disclosure.

A horizontally configured oven 20 is used to perform the batch-annealing of a plurality of bonded structures 5 such as described above. This type of heat treatment apparatus 20 comprises a charge shovel 21 that bears cassettes 22 into which the bonded structures 5 are placed (FIG. 7). The charge shovel 21 moves between an entered position, in which the bonded structures 5 are inside the oven 20, and an exited position, in which they are outside the oven 20.

A system of wedges 10 may be positioned on each cassette 22, under the bonded structures 5. The charge shovel 21 moves to the entered position for the anneal to be performed. The anneal comprises a temperature ramp-up from 200° C. to 380° C., a hold at 380° C. for two minutes and a temperature ramp-down to 225° C.

Upon completion of the anneal, the charge shovel 21 moves to its exited position.

As illustrated in FIG. 6, as soon as each bonded structure 5 has exited the oven 20, the temperature it experiences decreases. Each bonded structure 5 will move on to an exit zone 23 in which it will experience a maximum temperature (in its hottest region) between 150° C. and 250° C. In this exit zone 23, a pressing device 11 located above the bonded structures 5 will exert a pressing force on each bonded structure 5 successively, such that the wedge 10 thereunder will be inserted, at the bonding interface 7, between the chamfered edges of the joined substrates of the bonded structure 5 (FIG. 7). The insertion of the wedge 10 generates local tensile strain at the site of the buried weakened plane 2, allowing the splitting wave to be initiated in each bonded structure 5 in succession as they pass beneath the pressing device 11.

Of course, tools other than the assembly formed by the system of wedges 10 and the pressing device 11 could be implemented to initiate the splitting wave in the bonded structures 5 in accordance with the present disclosure.

The splitting wave is thus initiated for each bonded structure 5 when this structure is subjected to a maximum temperature between 150° C. and 250° C., preferably, around 200° C. In the example of FIG. 6, the exit zone 23 in which the splitting wave is initiated corresponds to a zone in which each bonded structure 5 is subjected, in its hottest region (top region H), to a maximum temperature of about 200° C., its central region C experiencing an intermediate temperature of about 180° C. and its bottom region B experiencing a temperature of about 130° C. Since the wedge 10 is, in the example illustrated in FIG. 7, positioned at the bottom portion of each bonded structure 5, initiation furthermore occurs in the cool region (bottom region B: that which experiences the lowest temperatures) of the bonded structure 5.

Following the self-sustained propagation of the splitting wave, what is obtained, after transfer, is the SOI substrate (transferred assembly 5a) and the remainder 5b of the donor substrate 1. A very high degree of uniformity of thickness is obtained for the transferred useful layers 3.

Finishing steps applied to the transferred assemblies 5a comprise chemical cleaning operations and at least one high-temperature smoothing heat treatment. Upon completion of these steps, the SOI substrates include a useful layer 3 with a thickness of 50 nm, the final non-uniformity of thickness of which is about 0.45 nm. It should be noted that, in comparison, SOI substrates of which the useful layer 3 includes regular or irregular patterns after splitting may exhibit final non-uniformities of thickness that are greater than or equal to 0.7 nm.

Of course, the present disclosure is not limited to the described implementations and examples, and variant embodiments may be introduced thereinto without departing from the scope of the invention as defined by the claims.

The invention claimed is:

1. A method for transferring a useful layer to a carrier substrate, comprising the following steps:
    a) providing a donor substrate including a buried weakened plane, the useful layer being delimited by a front face of the donor substrate and the buried weakened plane;
    b) providing the carrier substrate;
    c) joining the donor substrate, by the front face of the donor substrate, to the carrier substrate along a bonding interface so as to form a bonded structure;
    d) annealing the bonded structure without initiating a splitting wave in the buried weakened plane by applying a weakening thermal budget thereto bringing the buried weakened plane to a defined level of weakening, the weakening thermal budget being less than a splitting thermal budget, the splitting thermal budget leading to spontaneous initiation of the splitting wave in the buried weakened plane during the annealing; and
    e) after the annealing of the bonded structure to apply the weakening thermal budget, initiating the splitting wave in the buried weakened plane by applying a stress to the bonded structure, the splitting wave propagating in a self-sustained manner along the buried weakened plane to result in the useful layer being transferred to the carrier substrate;
    wherein the splitting wave is initiated when the bonded structure is subjected, at least in its hottest region, to a temperature between 150° C. and 250° C.

2. The method of claim 1, wherein the maximum temperature is between 180° C. and 220° C.

3. The method of claim 2, wherein the annealing in step d) reaches a maximum hold temperature between 300° C. and 600° C.

4. The method of claim 3, wherein the weakening thermal budget is between 40% and 95% of the splitting thermal budget, the splitting thermal budget leading to spontaneous initiation of the splitting wave in the buried weakened plane during the annealing.

5. The method of claim 4, wherein the initiation in step e) takes place directly after the annealing in step d), before the hottest region of the bonded structure reaches a temperature below 150° C.

6. The method of claim 5, wherein the annealing in step d) takes place in a horizontally or vertically configured heat treatment apparatus suitable for batch-treating a plurality of bonded structures, and wherein the initiation in step e) takes place when the plurality of bonded structures exit the apparatus.

7. The method of claim 6, wherein the application of a stress to the buried weakened plane corresponds to the application of a local mechanical load to the bonded structure.

8. The method of claim 7, wherein the local mechanical load is applied by inserting a wedge at the bonding interface of the bonded structure, between respective chamfered edges of the donor substrate and of the carrier substrate of the bonded structure.

9. The method of claim 8, wherein the local mechanical load is applied in a region of the bonded structure that experiences lower temperatures when there is a temperature gradient across the bonded structure in step e).

10. The method of claim 9, wherein the local mechanical load is applied to the bonded structure when the temperature gradient is about 80° C.

11. The method of claim 10, wherein the donor substrate and the carrier substrate comprise monocrystalline silicon, and wherein the buried weakened plane is formed by ion implantation of light species into the donor substrate, the light species being chosen from hydrogen or helium, or a combination of hydrogen and helium.

12. The method of claim 1, wherein the annealing in step d) reaches a maximum hold temperature between 300° C. and 600° C.

13. The method of claim 1, wherein the weakening thermal budget is between 40% and 95% of the splitting thermal budget.

14. The method of claim 1, wherein the initiation in step e) takes place directly after the annealing in step d), before the hottest region of the bonded structure reaches a temperature below 150° C.

15. The method of claim 1, wherein the annealing in step d) takes place in a horizontally or vertically configured heat treatment apparatus suitable for batch-treating a plurality of bonded structures, and wherein the initiation in step e) takes place when the plurality of bonded structures exit the apparatus.

16. The method of claim 1, wherein the application of a stress to the buried weakened plane corresponds to the application of a local mechanical load to the bonded structure.

17. The method of claim 16, wherein the local mechanical load is applied by inserting a wedge at the bonding interface of the bonded structure, between respective chamfered edges of the donor substrate and of the carrier substrate of the bonded structure.

18. The method of claim 16, wherein the local mechanical load is applied in a region of the bonded structure that experiences lower temperatures when there is a temperature gradient across the bonded structure in step e).

19. The method of claim 18, wherein the local mechanical load is applied to the bonded structure when the temperature gradient is about 80° C.

20. The method of claim 1, wherein the donor substrate and the carrier substrate comprise monocrystalline silicon, and wherein the buried weakened plane is formed by ion implantation of light species into the donor substrate, the light species being chosen from hydrogen or helium, or a combination of hydrogen and helium.

* * * * *

UNITED STATES PATENT AND TRADEMARK OFFICE
CERTIFICATE OF CORRECTION

PATENT NO. : 11,881,429 B2
APPLICATION NO. : 17/439300
DATED : January 23, 2024
INVENTOR(S) : Didier Landru, Oleg Kononchuk and Nadia Ben Mohamed It is certified that error appears in the above-identified patent and that said Letters Patent is hereby corrected as shown below:

In the Specification

Column 6, Line 66, change "using the SURF SCAN™ inspection" to --using the SURFSCAN™ inspection--

Signed and Sealed this
Nineteenth Day of March, 2024

Katherine Kelly Vidal
*Director of the United States Patent and Trademark Office*